(12) United States Patent
Hsu et al.

(10) Patent No.: US 10,152,149 B2
(45) Date of Patent: Dec. 11, 2018

(54) COMPOSITE SUBSTRATE STRUCTURE AND TOUCH PANEL HAVING THE SAME

(71) Applicant: TPK TOUCH SOLUTIONS (XIAMEN) INC., Xiamen (CN)

(72) Inventors: I-Chung Hsu, Taipei (TW); Kuo-Shu Hsu, Taipei (TW); Chunyong Zhang, Xiamen (CN); Yuchuan Wu, Yongding (CN); Bangxiong Huang, Xiamen (CN); Binghui Chen, Xiamen (CN)

(73) Assignee: TPK Touch Solutions (Xiamen) Inc., Xiamen (CN)

( * ) Notice: Subject to any disclaimer, the term of this patent is extended or adjusted under 35 U.S.C. 154(b) by 174 days.

(21) Appl. No.: 14/623,520

(22) Filed: Feb. 17, 2015

(65) Prior Publication Data

US 2015/0248140 A1   Sep. 3, 2015

(30) Foreign Application Priority Data

Feb. 28, 2014  (CN) .......................... 2014 1 0072057
Oct. 24, 2014  (CN) .......................... 2014 1 0576664

(51) Int. Cl.
| | |
|---|---|
| *G06F 1/16* | (2006.01) |
| *G06F 3/041* | (2006.01) |
| *C03C 17/22* | (2006.01) |
| *C03C 17/34* | (2006.01) |
| *C03C 17/42* | (2006.01) |

(52) U.S. Cl.
CPC .............. *G06F 3/041* (2013.01); *C03C 17/22* (2013.01); *C03C 17/3441* (2013.01); *C03C 17/42* (2013.01); *C03C 2217/28* (2013.01); *C03C 2217/282* (2013.01); *C03C 2217/734* (2013.01); *C03C 2217/76* (2013.01); *C03C 2217/78* (2013.01); *H01L 2924/0002* (2013.01); *Y10T 428/24942* (2015.01); *Y10T 428/24975* (2015.01); *Y10T 428/265* (2015.01)

(58) Field of Classification Search
CPC . G06F 1/16; G06F 3/041; C03C 17/22; C03C 17/3441; C03C 17/42; C03C 2217/28; C03C 2217/282; C03C 2217/734; C03C 2217/76; C03C 2217/78; Y10T 428/24942; Y10T 428/24975; Y10T 428/265; H01L 2924/0002; H01L 2924/00
See application file for complete search history.

(56) References Cited

U.S. PATENT DOCUMENTS

| | | | |
|---|---|---|---|
| 6,368,664 B1* | 4/2002 | Veerasamy | B05D 5/083 427/249.15 |
| 2003/0179454 A1* | 9/2003 | Thomsen | C03C 17/36 359/584 |
| 2005/0030629 A1* | 2/2005 | Kursawe | G02B 1/116 359/586 |

(Continued)

*Primary Examiner* — Amare Mengistu
*Assistant Examiner* — Jennifer Zubajlo
(74) *Attorney, Agent, or Firm* — Cooper Legal Group, LLC

(57) ABSTRACT

The present disclosure provides a composite substrate structure and a touch panel having composite substrate structure, for promoting abrasion resistance, visual transparency, and appearance. The composite substrate structure includes a transparent substrate and a diamond-like carbon layer. The diamond-like carbon layer is disposed on the transparent substrate and has a thickness less than or equal to about 15 nanometers.

17 Claims, 7 Drawing Sheets

(56) References Cited

U.S. PATENT DOCUMENTS

| | | | |
|---|---|---|---|
| 2006/0132026 A1* | 6/2006 | Sarma | H01L 51/5088 |
| | | | 313/504 |
| 2012/0164454 A1* | 6/2012 | Sung | C23C 16/26 |
| | | | 428/408 |
| 2012/0212826 A1* | 8/2012 | Henn | C03C 17/3435 |
| | | | 359/586 |
| 2012/0263936 A1* | 10/2012 | Krzyak | C03C 17/3417 |
| | | | 428/304.4 |

* cited by examiner

COMPOSITE SUBSTRATE STRUCTURE AND TOUCH PANEL HAVING THE SAME

BACKGROUND OF THE INVENTION

This Non-provisional application claims priority on Patent Application No. 201410072057.2 filed in People's Republic of China on Feb. 28, 2014 and No. 201410576664.2 filed in People's Republic of China on Oct. 24, 2014, the entire contents of which are hereby incorporated by reference.

Field of the Invention

The present disclosure relates to a promoted substrate structure, and in particular, to a composite substrate structure applied to a touch panel.

Description of Related Art

Touch panels are widely implemented in electronic devices as user interface technology advances. For example, smart phones, tablet computers, cameras, e-book readers, MP3 players and other portable electronic products widely include touch panels applied to display screens thereof as and operational control apparatus.

When operating a product having a touch panel, the user typically uses his/her finger or a stylus to contact the surface of a substrate of the touch panel, and a pressing or a sliding of the finger or stylus is conducted on the surface of the substrate. Some substrates are transparent, while others are semitransparent or opaque.

SUMMARY OF THE INVENTION

The present disclosure provides a composite substrate structure and a touch panel having composite substrate structure, for promoting abrasion resistance of the surface of a transparent substrate through the composite structure having a diamond-like carbon layer on the surface thereof.

According to one exemplary embodiment of the instant disclosure, a composite substrate structure includes a transparent substrate and a diamond-like carbon layer disposed on the transparent substrate. The diamond-like carbon layer has a thickness less than or equal to about 15 nanometers.

According to another exemplary embodiment of the instant disclosure, a touch panel having composite substrate structure includes a transparent substrate, which has a first face and a second face parallel with the first face, a diamond-like carbon layer disposed on the transparent substrate and positioned on the first face, and a touch control unit disposed under the second face of the transparent substrate. The diamond-like carbon layer has a thickness less than or equal to about 15 nanometers.

In order to further the understanding regarding the present disclosure, the following embodiments are provided along with illustrations to facilitate the disclosure of the present disclosure.

DETAILED DESCRIPTION OF THE PREFERRED EMBODIMENTS

The aforementioned illustrations and following detailed descriptions are exemplary for the purpose of further explaining the scope of the present disclosure. Other objectives and advantages related to the present disclosure will be illustrated in the subsequent descriptions and appended drawings.

It is to be noted that, in the descriptions, the word "upper", "lower", "above", and "under" are provided for purpose of illustration and description and relative positions of the components only. It is not intended to be exhaustive or limiting to the precise form disclosed. With respect to the accompanying drawings, upper of the composite substrate structure is relatively closer to the user, while lower of the composite substrate structure is relatively further from the user.

Figure 1:
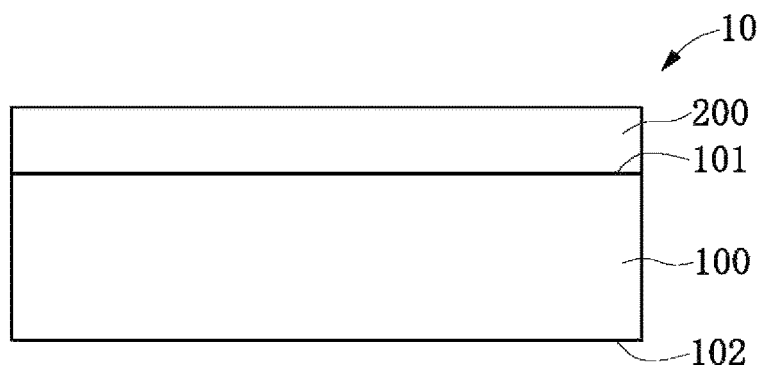
FIG. 1 shows a cross-sectional view of a composite substrate structure according to one or more embodiments of the present disclosure.

Please refer to FIG. 1 for an explanation of a composite substrate structure according to the present disclosure. FIG. 1 shows a cross-sectional view of a composite substrate structure according to one or more embodiments of the present disclosure. As shown in FIG. 1, the composite substrate structure 10 includes a transparent substrate 100 having a first face 101 and a second face 102 opposite to the first face 101. The first face 101 and the second face 102 are arranged substantially parallel with each other. In some embodiments, the transparent substrate 100 is made of insulating and visually transparent materials. In some embodiments, the transparent substrate 100 is formed of a material including ethylene terephthalate, polyether sulfone, polyacrylate, polyethylene naphthalate, polyethylene terephthalate, polyphenylene sulfide, polyallylate, polycarbonate, polyethylene terephthalate polyethylene terephthalate or glass. In some embodiments, the transparent substrate 100 is a stiff plate or a pliable plate. In some embodiments, the transparent substrate 100 is a flat board, a curved board, or in different shapes. In at least one embodiment, the transparent substrate 100 is a flat board. The composite substrate structure 10 further includes a diamond-like carbon layer 200 formed on the transparent substrate 100. The diamond-like carbon layer 200 is positioned on the first face 101, and the present disclosure is not limited thereto. In some embodiments, the diamond-like carbon layer 200 is disposed merely on one surface of the transparent substrate 100 or on a plurality of surfaces of the transparent substrate 100.

The diamond-like carbon layer 200 of the composite substrate structure 10 is configured to meet various objectives. At least two considerations are contemplated herein.

First, the diamond-like carbon layer 200 can have $sp^2$ bond graphite structures and $sp^3$ bond diamond cubic structures. The $sp^3$ bonds diamond cubic structure has better hardness, better scratch resistance, and better wear resistance, while also having relatively high internal stress and a weak bonding force with the transparent substrate 100. Consequently, a high $sp^3$ bond-containing diamond-like carbon layer 200 may have poor adhesion with respect to the transparent substrate 100. Thus, the process of forming a diamond-like carbon layer 200 on the transparent substrate 100 promotes the adhesion of the diamond-like carbon layer 200 with respect to the transparent substrate 100. For example, the thickness of the diamond-like carbon layer 200 formed on the transparent substrate 100 is decreased to reduce the internal stress thereof.

Second, considering the visual transparency of the diamond-like carbon layer 200, the $sp^2$ bond graphite structure has a greater impact on the optical properties of the diamond-like carbon layer 200 than the $sp^3$ bond diamond cubic structure. Specifically, the more graphite structures having $sp^2$ bonds contained in the diamond-like carbon layer 200, the poorer the visual transparency of the diamond-like carbon layer 200 is. The fewer graphite structures having $sp^2$ bonds contained in the diamond-like carbon layer 200, the better the visual transparency of the diamond-like carbon layer 200 is.

Therefore, to optimize the adhesion and the visual transparency, it is preferred that, the diamond-like carbon layer 200 has thickness less than or equal to about 15 nanometers and has a content percentage of $sp^3$ bonds greater than or equal to about 15%. The content percentage of $sp^3$ bonds of the diamond-like carbon layer 200 is, as a specific example, about 30% or about 50% according to needs.

In some embodiments, the diamond-like carbon layer 200 according to the present disclosure is formed on the surface of the transparent substrate 100 by sputtering. The content percentage of $sp^3$ bonds in the diamond-like carbon layer 200 is regulated by controlling the flow rate of hydrogen and the dissociation energy. The diamond-like carbon layer 200 formed by sputtering can have a content percentage of $sp^3$ bonds greater than or equal to about 15% when the flow rate of hydrogen is controlled to greater than 12 sccm (standard cubic centimeter per minute) and the dissociation energy is controlled to 100 to 700 eV (electron volt).

It is worth mentioning that, in addition to the visual transparency and the adhesion, according to the present disclosure, there are further considerations directed to the visual effect of the composite substrate structure 10.

The visual effect of the composite substrate structure 10 is related at least to the thickness of the diamond-like carbon layer 200. Experimental results show that the greater the thickness of the diamond-like carbon layer 200 of the composite substrate structure 10, the poorer the visual transparency of the composite substrate structure 10, and the more apparent the appearance of yellow color, which is known as a yellowing phenomenon in the related field. The yellowing phenomenon is seen by a naked eye if the thickness of the diamond-like carbon layer 200 is increased to greater than about 10 nanometers. The yellowing phenomenon is so serious that the visual effect of the composite substrate structure 10 is affected, if the thickness of the diamond-like carbon layer 200 is increased to greater than about 15 nanometers.

Therefore, considering the visual transparency, the adhesion, and the yellowing phenomenon, in some embodiments, the diamond-like carbon layer 200 has a preferred thickness of less than about 10 nanometers. In other preferred embodiment, the diamond-like carbon layer 200 can have a thickness ranging from about 2 nanometers to about 5 nanometers, resulting in a transparency of the composite substrate structure 10 greater than about 89%, and enabling the optimization of the visual effect and the adhesion property of the composite substrate structure 10. Transparency here and in the following is described as the amount of light transmitted divided by the amount of incident light times 100%, where the wavelength of the incident light is about 550 nanometers.

Figure 2:
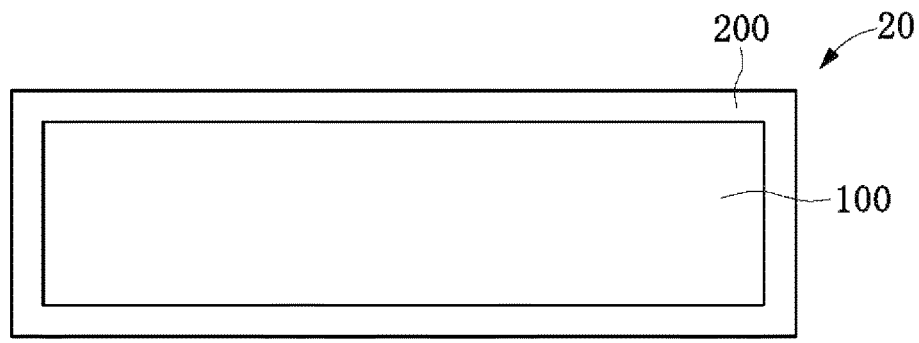
FIG. 2 shows a cross-sectional view of the composite substrate structure according to some embodiments of the present disclosure.

Refer to FIG. 2, which shows a cross-sectional view of the composite substrate structure according to one or more embodiments of the present disclosure. Components is similar to those of FIG. 1 are not described further described. In some embodiments, the diamond-like carbon layer 200 is disposed on all surfaces of the transparent substrate 100, such that the diamond-like carbon layer 200 is surroundingly covering the transparent substrate 100.

Figure 3:
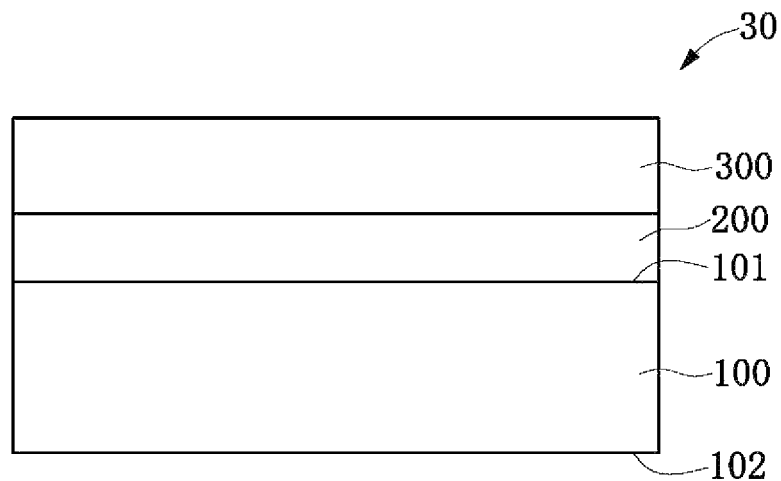
FIG. 3 shows a cross-sectional view of the composite substrate structure according to some embodiments of the present disclosure.

Refer to FIG. 3, which shows a cross-sectional view of the composite substrate structure according to one or more embodiments of the present disclosure. Components is similar to those of FIG. 1 or FIG. 2 are not further described. In some embodiments, the composite substrate structure 30 further includes a hydrophobic layer 300 disposed at a side of the diamond-like carbon layer 200 opposite to the transparent substrate 100. A surface of the hydrophobic layer 300 opposite to the diamond-like carbon layer 200 has a contact angle greater than 110 degrees. Thus, at the side opposite to the diamond-like carbon layer 200, the entire surface of the hydrophobic layer 300 can exhibit a preferred hydrophobic property. Experimental results show that when the contact angle of a surface of an object is greater than 90 degrees, the surface of the object seemingly repels a mass of liquid, such that liquid does not easily wet the object and moves easily on the surface thereof. In some embodiments, the material of the hydrophobic layer 300 includes a compound containing at least one of the elements fluorine, nitrogen or oxygen, for improving the hydrophobicity of the composite substrate structure 30.

The following describes a scratch resistance and wear resistance test carried out on the composite substrate structures 20, 30, respectively.

Experiment Conditions:
Use a 2 cm by 2 cm friction head wrapped with an ultra-fine steel wool under a force of 70 N for testing.
Experimental Results:
The composite substrate structure 30 having the hydrophobic layer 300 has better scratch resistance and wear resistance than the composite substrate structure 20 without a hydrophobic layer 300.

Experimental Results Show:

The composite substrate structure 30 having the hydrophobic layer 300 has a coefficient of surface friction less than that of the composite substrate structure 20 without a hydrophobic layer 300. The scratch resistance and the wear resistance of the composite substrate structure are related to the coefficient of surface friction. Specifically, the greater the coefficient of surface friction of the composite substrate structure, the poorer the scratch resistance and the wear resistance; the less the coefficient of surface friction of the composite substrate structure, the better the scratch resistance and the wear resistance.

Accordingly, the hydrophobic layer 300 improves the hydrophobicity of the composite substrate structure 30, thus preventing the surface of the composite substrate structure 30 from attracting oil or water. In addition, the composite substrate structure 30 having the hydrophobic layer 300 has a smaller coefficient of surface friction, resulting in fewer scratches and less wear when the composite substrate structure 30 is subjected to an external scratching force.

The greater the content percentage of hydrophobic atoms in the hydrophobic layer 300, the better the hydrophobicity of hydrophobic atoms in the hydrophobic layer 300, and thus the smaller the coefficient of surface friction. According to one or more of the present disclosure, the hydrophobic layer 300 has a content percentage of hydrophobic atoms (such as fluorine) greater than about 50%.

Moreover, it has been found in the actual production process that, the coefficient of surface friction of the hydrophobic layer 300 is related to a proportion of carbon-fluorine bonds to silicon-oxygen bonds therein.

The following describes a scratch resistance and wear resistance test carried out on the composite substrate structure 30 having the hydrophobic layer 300 with various proportions of carbon-fluorine bonds to silicon-oxygen bonds therein.

Experiment Conditions:

Dispose a dustless class 100 cloth on the composite substrate structure 30, and then dispose a 200-gram weight on the dustless cloth. Perform the scratch resistance and wear resistance test under a velocity of 100 mm/min for the composite substrate structure 30.

Experimental Results:

The composite substrate structure 30 with a proportion of carbon-fluorine bonds to silicon-oxygen bonds greater than or equal to 50:1 in the hydrophobic layer 300 has a coefficient of static friction less than or equal to about 0.1. The surface of the hydrophobic layer 300 has a preferred smoothness, and the scratch resistance and wear resistance thereof are improved.

Experimental Results Show:

The hydrophobic layer 300 improves the surface smoothness of the composite substrate structure 30, thus enhancing the scratch resistance and the wear resistance of the composite substrate structure 30 that when subjected to an external scratching force.

In some embodiments of the present disclosure, the hydrophobic layer 300 can become crystalline by a baking process or the like. In the hydrophobic layer 300 formed by a baking process, molecules are arranged in a highly ordered microscopic structure, such that the hydrophobic layer 300 can have a preferred density. The density of the hydrophobic layer 300 is greater, and the coefficient of friction of the hydrophobic layer 300 is more stable and keeps a low value. The composite substrate structure 30 with the hydrophobic layer 300 that has a crystal proportion greater than about 50% can have a significantly improved scratch resistance or wear resistance.

However, the greater the thickness of the hydrophobic layer 300, the poorer the visual transparency thereof. To optimize the hydrophobicity and the visual transparency, it is preferred that, the hydrophobic layer 300 has a thickness ranging from about 5 nanometers to about 30 nanometers.

Figure 4:
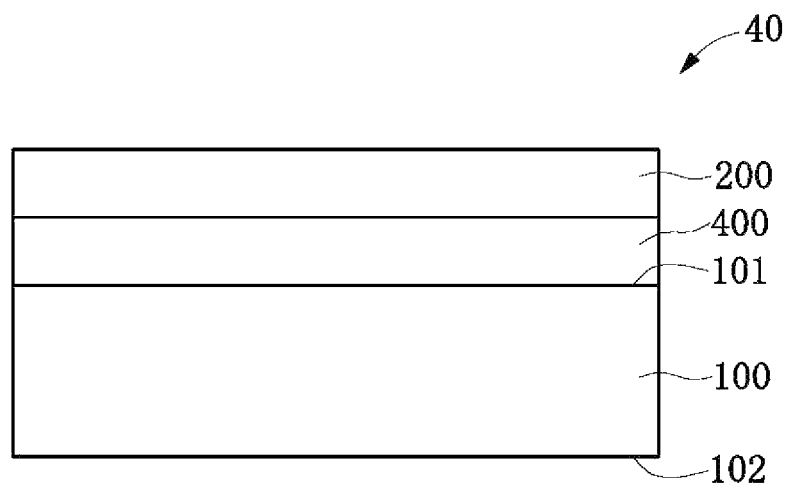
FIG. 4 shows a cross-sectional view of the composite substrate structure according to some embodiments of the present disclosure.

Refer to FIG. 4, which shows a cross-sectional view of the composite substrate structure according to one or more embodiments of the present disclosure. Components which is similar to those of FIG. 1, FIG. 2 or FIG. 3 are not further described. In some embodiments, the composite substrate structure 40 further includes an adhesive layer 400 disposed between the transparent substrate 100 and the diamond-like carbon layer 200, and the adhesive layer 400 includes a silicon-based material. In some embodiments, the adhesive layer 400 is configured for enhancing the bonding between the diamond-like carbon layer 200 and the transparent substrate 100. Specifically, the silicon atoms in the adhesive layer 400 can move into the silica network structure of the transparent substrate 100 (such as a glass substrate) and also can move into the carbon-hydrogen mesh structure in the diamond-like carbon layer 200, facilitates the bonding exchange between the transparent substrate 100 and the diamond-like carbon layer 200, thus increasing the adhesion there between. In an exemplary embodiment, the adhesive layer 400 is a silicon dioxide layer, and the present disclosure is not limited thereto.

In some embodiments, on the one hand, through the disposed adhesive layer 400, delamination caused by inner stress due to the difference of compositions between the diamond-like carbon layer 200 and the transparent substrate 100 is avoided, whereby the diamond-like carbon layer 200 is firmly bonded to the transparent substrate 100. On the other hand, the adhesive layer 400 (such as silicon dioxide), which is formed with fine particles, may also provide a surface of preferred flatness for the subsequent lamination of the diamond-like carbon layer 200.

However, the greater the thickness of the adhesive layer 400, the poorer the visual transparency thereof. To optimize the adhesion and the visual transparency, it is preferred that, the adhesive layer 400 has a thickness ranging from about 5 nanometers to about 10 nanometers.

Figure 5:
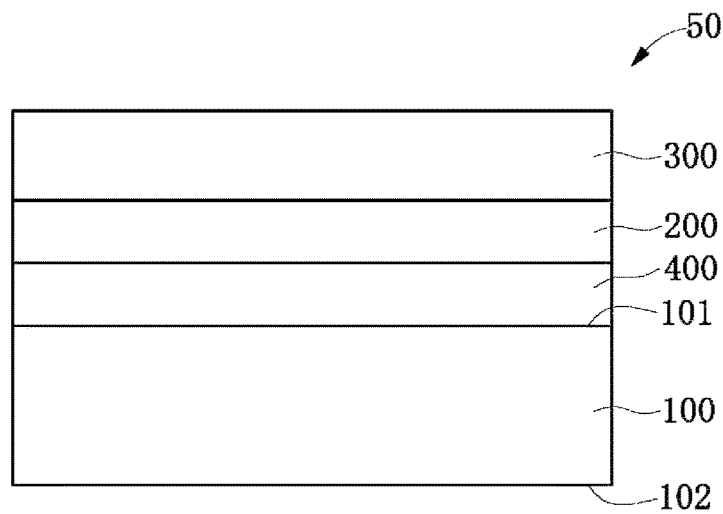
FIG. 5 shows a cross-sectional view of the composite substrate structure according to some embodiments of the present disclosure.

Refer to FIG. 5, which shows a cross-sectional view of the composite substrate structure according to one or more embodiments of the present disclosure. Components is similar to those of FIG. 1 to FIG. 4 are not further described. In some embodiments, the composite substrate structure 50 further includes a hydrophobic layer 300 disposed on the diamond-like carbon layer 200.

Figure 6:
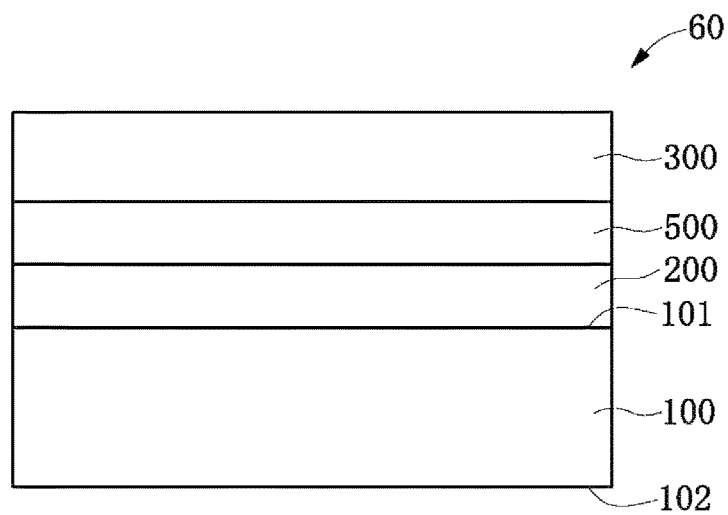
FIG. 6 shows a cross-sectional view of the composite substrate structure according to some embodiments of the present disclosure.

Refer to FIG. 6, which shows a cross-sectional view of the composite substrate structure according to one or more embodiments of the present disclosure. Components is similar to those of FIG. 1 to FIG. 5 are not further described. In some embodiments, the composite substrate structure 60 further includes a middle layer 500 disposed between the diamond-like carbon layer 200 and the hydrophobic layer 300. For example, the middle layer 500 is formed of a silicon carbon based material. The middle layer 500 has a content percentage of silicon atoms ranging from about 10% to about 20% and a content percentage of carbon atoms ranging from about 80% to about 90%.

In some embodiments, through the middle layer 500, the bonding interface between the middle layer 500 and the diamond-like carbon layer 200 and the bonding interface between the middle layer 500 and the hydrophobic layer 300 can have similar atomic structures, whereby the hydrophobic layer 300 is firmly bonded to the diamond-like carbon layer 200. In addition, delamination caused by inner stress due to the difference of compositions between the diamond-like carbon layer 200 and the hydrophobic layer 300 is avoided.

However, the greater the thickness of the middle layer 500, the poorer the visual transparency of the composite substrate structure 60. To optimize the visual transparency and the adhesion of the composite substrate structure 60, it is preferred that, the middle layer 500 have a thickness ranging from about 10 nanometers to about 13 nanometers.

Figure 7:
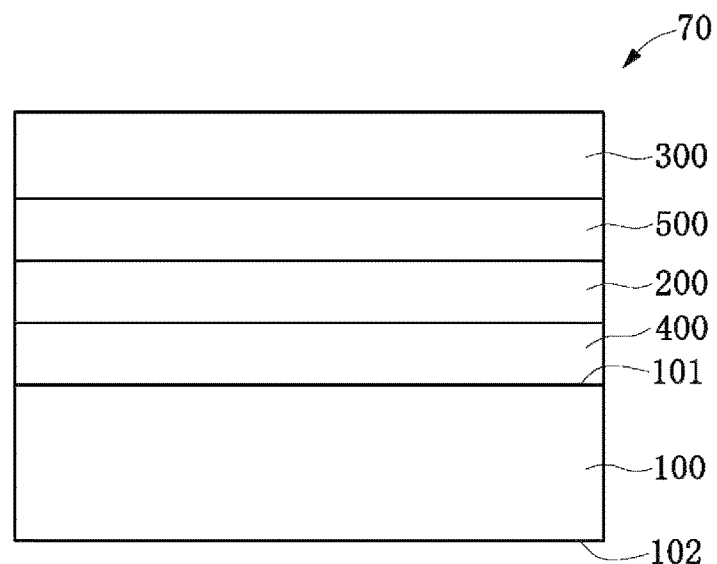
FIG. 7 shows a cross-sectional view of the composite substrate structure according to some embodiments of the present disclosure.

Refer to FIG. 7, which shows a cross-sectional view of the composite substrate structure according to one or more embodiments of the present disclosure. Components is similar to those of the above embodiments are not further described. In some embodiments, the composite substrate structure 70 further includes an adhesive layer 400 disposed between the transparent substrate 100 and the diamond-like carbon layer 200.

Figure 8:
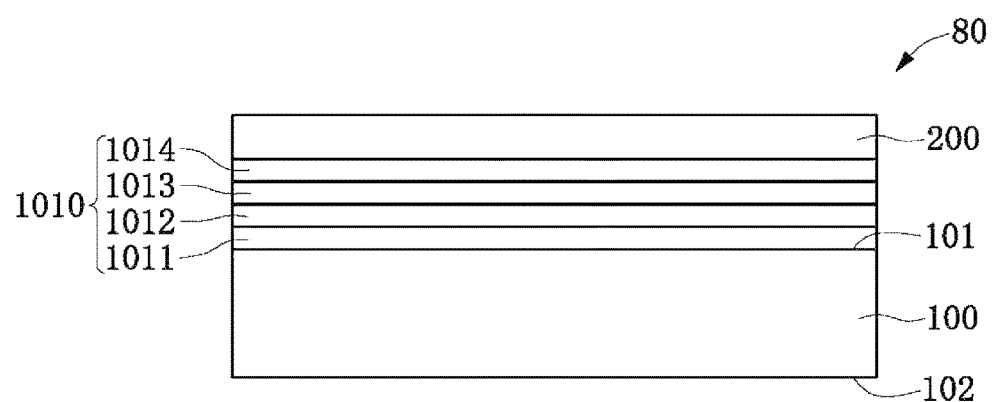
FIG. 8 shows a cross-sectional view of the composite substrate structure according to some embodiments of the present disclosure.

Refer to FIG. 8, which shows a cross-sectional view of the composite substrate structure according to one or more embodiments of the present disclosure. Components is similar to those of FIG. 1 to FIG. 7 are not further described. In some embodiments, the composite substrate structure 80 further includes an anti-reflection film 1010 disposed between the transparent substrate 100 and the diamond-like carbon layer 200. The anti-reflection film 1010 may include a plurality of first anti-reflection layers 1011, 1013 and a plurality of second anti-reflection layers 1012, 1014. The first anti-reflection layers 1011, 1013 and the second anti-reflection layers 1012, 1014 are alternately laminated. For example, in the direction extending outwardly from the transparent substrate 100, a first anti-reflection layer 1011, a second anti-reflection layer 1012, a first anti-reflection layer 1013, and a second anti-reflection layer 1014 are sequentially laminated. In some embodiments, the anti-reflection film 1010 includes two first anti-reflection layers and two second anti-reflection layers, but the present disclosure is not limited thereto. For example, the number of the first anti-reflection layers or the number of the second anti-reflection layers is three, four, or greater than four. It is noted that, the number of the first anti-reflection layers corresponds to the number of the second anti-reflection layers, and the first anti-reflection layers and the second anti-reflection layers each are alternately laminated.

In some embodiments, in the anti-reflection film 1010 disposed between the transparent substrate 100 and the diamond-like carbon layer 200, a first anti-reflection layer 1011 is arranged adjacent to the transparent substrate 100, and a second anti-reflection layer 1014 is arranged adjacent to the diamond-like carbon layer 200. The second anti-reflection layers 1012, 1014 each have a refractive index less than that of each of the first anti-reflection layers 1011, 1013. For example, the first anti-reflection layers 1011, 1013 each have a refractive index greater than about 1.6, and the second anti-reflection layers 1012, 1014 each have a refractive index less than about 1.55. In some preferred embodiment, the first anti-reflection layers 1011, 1013 each have a refractive index greater than about 1.8, and the second anti-reflection layers 1012, 1014 each have a refractive index less than about 1.5.

In some embodiments, The first anti-reflection layers 1011, 1013 each are mainly formed of niobium oxide, titanium oxide (TiO2, Ti3O5, Ti2O3), zirconium oxide, aluminum oxide (Al2O3), silicon oxynitride or silicon nitride, and the second anti-reflective layers 1012, 1014 each are mainly formed of silicon oxide or magnesium fluoride.

Through the anti-reflection film 1010 disposed on the transparent substrate 100, the visual transparency of the composite substrate structure 80 is improved, such that the composite substrate structure 80 can have a transparency greater than about 92%. The impact of external light in the environment on the transparent substrate 100 is significantly reduced. The anti-reflection effect of the transparent substrate 100 is improved, and the optical property of the composite substrate structure 80 is reinforced.

In some embodiments, the composite substrate structure 80 may further include a hydrophobic layer 300 (not shown in FIG. 8) disposed on the diamond-like carbon layer 200, for improving the hydrophobicity of the composite substrate structure 80 and reducing the coefficient of surface friction of the composite substrate structure 80. Additionally, in the composite substrate structure 80 having the hydrophobic layer 300, a middle layer 500 (not shown in FIG. 8) is selectively disposed between the diamond-like carbon layer 200 and the hydrophobic layer 300, whereby the hydrophobic layer 300 is firmly bonded to the diamond-like carbon layer 200.

Figure 9:
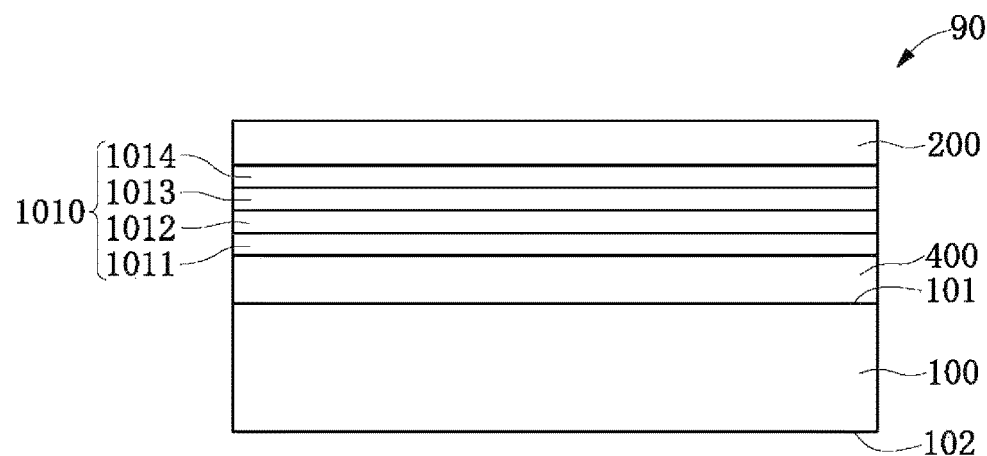
FIG. 9 shows a cross-sectional view of the composite substrate structure according to some embodiments of the present disclosure.

Refer to FIG. 9, which shows a cross-sectional view of the composite substrate structure according to one or more embodiments of the present disclosure. Components is similar to those of FIG. 1 to FIG. 8 are not further described. In some embodiments, the composite substrate structure 90 further includes an adhesive layer 400 disposed between the transparent substrate 100 and the anti-reflection film 1010, in which the first anti-reflection layer 1011 is arranged adjacent to the adhesive layer 400, and the second anti-reflection layer 1014 is arranged adjacent to the diamond-like carbon layer 200.

Similarly, in some embodiments, the composite substrate structure 90 may further include a hydrophobic layer 300 (not shown in FIG. 9) disposed on the diamond-like carbon layer 200, for improving the hydrophobicity of the composite substrate structure 90 and reducing the coefficient of surface friction of the composite substrate structure 90. Additionally, in the composite substrate structure 90 having the hydrophobic layer 300, a middle layer 500 (not shown in FIG. 9) is selectively disposed between the diamond-like carbon layer 200 and the hydrophobic layer 300, whereby the hydrophobic layer 300 is firmly bonded to the diamond-like carbon layer 200.

Figure 10:
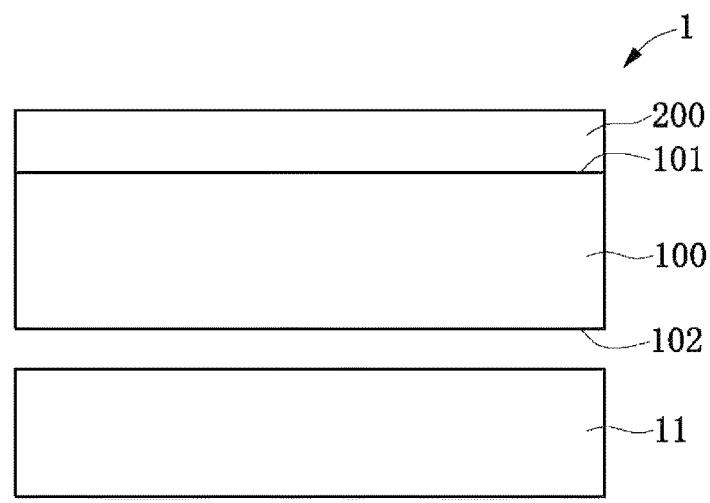
FIG. 10 shows a cross-sectional view of a touch panel having composite substrate structure of FIG. 1 in accordance with various embodiments of the present disclosure.

Refer to FIG. 10, which shows a cross-sectional view of a touch panel having composite substrate structure of FIG. 1 in accordance with various embodiments of the present disclosure. As shown in FIG. 10, the touch panel 1 includes a transparent substrate 100 having a first face 101 and a second face 102 parallel with the first face 101. The transparent substrate 100 is made of insulating and visually transparent materials. The transparent substrate 100 is formed of a material including ethylene terephthalate, polyether sulfone, polyacrylate, polyethylene naphthalate, polyethylene terephthalate, polyphenylene sulfide, polyallylate, polycarbonate, polyethylene terephthalate polyethylene terephthalate, glass or the like. The transparent substrate 100 is a stiff plate or a pliable plate. The transparent substrate 100 is a flat board, a curved board, or in different shapes. In some embodiments, the transparent substrate 100 is, as a specific example, a flat board.

The touch panel 1 further includes a diamond-like carbon layer 200 formed on the transparent substrate 100. The following only describes a specific example of the present embodiment, in which the diamond-like carbon layer 200 is positioned on the first face 101 of the transparent substrate 100. It is preferred that, the diamond-like carbon layer 200 is positioned on the first face 101 for the following reasons. The touch panel 1 is configured to apply to a touch control electronic device (such as a smart phone or a table computer). In the touch panel 1 assembled with other components for forming a touch control electronic device, the first face 101 of the transparent substrate 100, where a touch by the user is conducted to operate the touch control electronic device, needs to be exposed, while the other faces of the transparent substrate 100 are covered by the other components. When a touch by the user is conducted, an external force may result in scratches or cavities on the first face 101. The diamond-like carbon layer 200 laminated on the first face 101 is configured for protecting the first face 101 from scratches or cavities. In some embodiments, the diamond-like carbon layer 200 is laminated on other faces of the transparent substrate 100. For example, the diamond-like carbon layer 200 disposed on the transparent substrate 100 is positioned under the second face 102, and the present disclosure is not limited thereto.

In particular, the diamond-like carbon layer 200 of the touch panel 1 is designed to meet the needs of its application on the touch panel. At least two considerations are contemplated herein:

First, the diamond-like carbon layer 200 can have $sp^2$ bond graphite structures and $sp^3$ bond diamond cubic structures. The $sp^3$ bonds diamond cubic structure has better hardness, better scratch resistance, and better wear resistance, while also has relatively high internal stress and poor adhesion with the transparent substrate 100. Thus, the process of forming a diamond-like carbon layer 200 on the transparent substrate 100 promotes the adhesion of the diamond-like carbon layer 200 with respect to the transparent substrate 100. For example, the thickness of the diamond-like carbon layer 200 formed on the transparent substrate 100 is decreased to reduce the internal stress thereof.

Second, considering the visual transparency of the diamond-like carbon layer 200, the $sp^2$ bonds graphite structure has a greater impact on the optical property of the diamond-like carbon layer 200 than the $sp^3$ bonds diamond cubic structure. Specifically, the more graphite structures having $sp^2$ bonds contained in the diamond-like carbon layer 200, the poorer the visual transparency of the diamond-like carbon layer 200 is. The fewer the graphite structures having $sp^2$ bonds contained in the diamond-like carbon layer 200, the better the visual transparency of the diamond-like carbon layer 200 is.

Therefore, to optimize the adhesion and the visual transparency of the diamond-like carbon layer 200, it is preferred that, the diamond-like carbon layer 200 has thickness less than or equal to about 15 nanometers and has a content percentage of $sp^3$ bonds greater than or equal to about 15%. The content percentage of $sp^3$ bonds of the diamond-like carbon layer 200 is, as a specific example, about 30% or about 50% according to needs.

In some embodiments, the diamond-like carbon layer 200 according to the present disclosure is formed on the surface of the transparent substrate 100 by sputtering. The content percentage of $sp^3$ bonds in the diamond-like carbon layer 200 is regulated by controlling the flow rate of hydrogen and the dissociation energy. The diamond-like carbon layer 200 formed by sputtering can have a content percentage of $sp^3$ bonds greater than or equal to about 15% when the flow rate of hydrogen is controlled to greater then 12 sccm (standard cubic centimeter per minute) and the dissociation energy is controlled to 100 to 700 eV (electron volt).

It is worth mentioning that, the visual effect of the touch panel 1 is related at least to the thickness of the diamond-like carbon layer 200. Experimental results show that the greater the thickness of the diamond-like carbon layer 200 of the touch panel 1, the poorer the visual transparency of the touch panel 1, and the more apparent the appearance of yellow color, which is known as a yellowing phenomenon in the related field. The yellowing phenomenon is seen by a naked eye if the thickness of the diamond-like carbon layer 200 is increased to greater than about 10 nanometers. The yellowing phenomenon is so serious that the visually effect of the touch panel 1 is affected, if the thickness of the diamond-like carbon layer 200 is increased to greater than about 15 nanometers.

Therefore, considering the visual transparency, the adhesion, and the yellowing phenomenon, in some embodiments, the diamond-like carbon layer 200 has a preferred thickness of less than about 10 nanometers. In another preferred embodiment, the diamond-like carbon layer 200 can have a thickness ranging from about 2 nanometers to about 5 nanometers, resulting to a transparency of the touch panel 1 greater than about 89%, and enabling the optimization of the visual effect and the adhesion property of the touch panel 1.

In other embodiments of the touch panel, the composite substrate structure 30, 40, 50, 60, or 70 described in FIG. 3 to FIG. 7 of the composite substrate structure is adapted to the touch panel 1, to improve the scratch resistance or the wear resistance of the surface thereof and to enable the touch panel 1 to resume a preferred optical effect.

Figure 11:
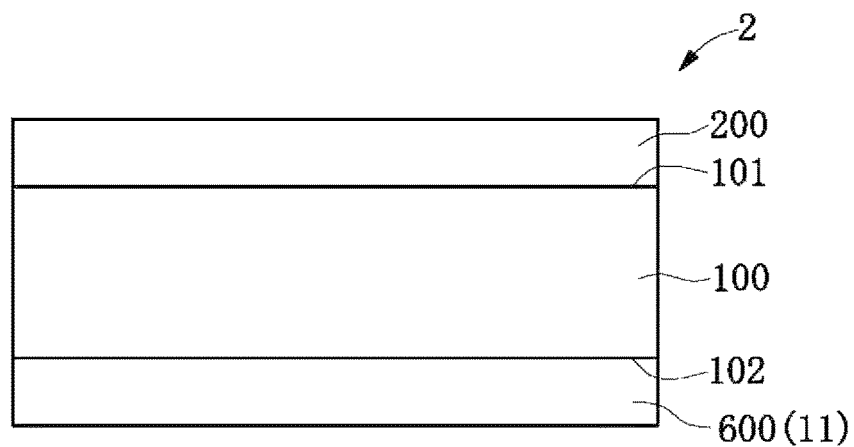
FIG. 11 shows a cross-sectional view of the touch panel having composite substrate structure according to of FIG. 1 in accordance with various embodiments of the present disclosure.

Refer to FIG. 11, which shows a cross-sectional view of the touch panel having composite substrate structure of FIG. 1 in accordance with various embodiments of the present disclosure. The touch panel 2 includes a touch control unit 11, and the touch control unit 11 includes a touch sensing electrode layer 600 disposed at the second face 102 of the transparent substrate 100. The touch sensing electrode layer 600 is configured to facilitate the operation of touch control by the user. The touch sensing electrode layer 600 is formed of visual transparent conductive materials such as indium tin oxide (ITO), indium zinc oxide (IZO), cadmium tin oxide (CTO), aluminum zinc oxide (AZO), indium tin zinc oxide (ITZO), zinc oxide, cadmium oxide (CdO), hafnium oxide (HfO), indium gallium zinc oxide (InGaZnO), indium gallium zinc magnesium oxide (InGaZnMgO), indium gallium magnesium oxide (InGaMgO), indium gallium aluminum oxide (InGaAlO), silver nanowires, carbon nanotubes, grapheme, and the like.

The touch sensing electrode layer 600 is formed with a plurality of first-axis electrodes and a plurality of second-axis electrodes (not shown in the Figures). In the instant disclosure, the first-axis electrodes and the second-axis electrodes are both disposed on the second face 102 of the transparent substrate 100.

Figure 12:
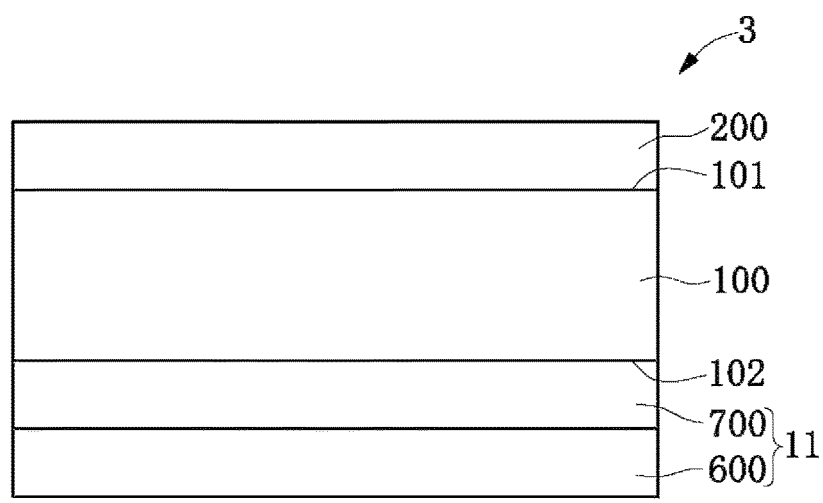
FIG. 12 shows a cross-sectional view of the touch panel having composite substrate structure of FIG. 1 in accordance with various embodiments of the present disclosure.

Refer to FIG. 12, which shows a cross-sectional view of the touch panel having composite substrate structure of FIG. 1 in accordance with various embodiments of the present disclosure. In some embodiments, the touch control unit 11 of the touch panel 3 includes a first supporting substrate 700 positioned under the transparent substrate 100. A touch sensing electrode layer 600 is disposed on the first supporting substrate 700. The touch sensing electrode layer 600 is formed with a plurality of first-axis electrodes and a plurality of second-axis electrodes (not shown in the Figures). In the instant disclosure, the first-axis electrodes and the second-axis electrodes are both disposed on the same face of the first supporting substrate 700. In some embodiments, the first-axis electrodes is disposed on a lower face of the first supporting substrate 700, and the second-axis electrodes is disposed on an upper face of the first supporting substrate 700. Alternatively, the second-axis electrodes is disposed on a lower face of the first supporting substrate 700, and the first-axis electrodes is disposed on an upper face of the first supporting substrate 700. In some embodiments, the first-axis electrodes is disposed on the second face 102 of the transparent substrate 100, and the second-axis electrodes is disposed on a face parallel with the second face 102 of the transparent substrate 100. Alternatively, the second-axis electrodes is disposed on the second face 102 of the transparent substrate 100, and the first-axis electrodes is disposed on a face parallel with the second face 102 of the transparent substrate 100.

Figure 13:
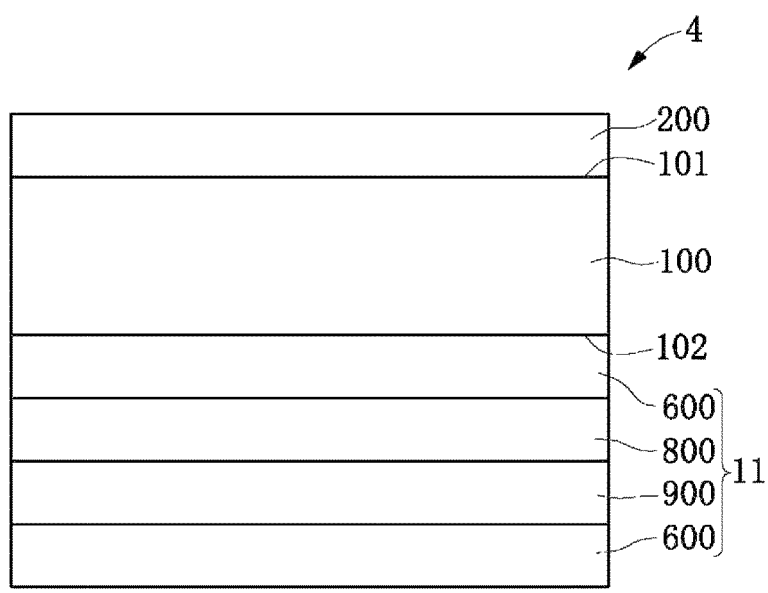
FIG. 13 shows a cross-sectional view of the touch panel having composite substrate structure of FIG. 1 in accordance with various embodiments of the present disclosure.

Refer to FIG. 13, which shows a cross-sectional view of the touch panel having composite substrate structure of FIG. 1 in accordance with various embodiments of the present disclosure. In some embodiments, the touch panel 4 further includes a second supporting substrate 800 and a third supporting substrate 900. The second supporting substrate 800 is positioned under the transparent substrate 100, and the third supporting substrate 900 is positioned under the second supporting substrate 800. The first-axis electrodes (or the second-axis electrodes) of the touch sensing electrode layer 600 are disposed on the lower face (or the upper face) of the second supporting substrate 800, while the second-axis electrodes (or the first-axis electrodes) of the touch sensing electrode layer 600 are disposed on a face parallel with the lower face (or the upper face) of the second supporting substrate 800.

The first supporting substrate 700, the second supporting substrate 800, and the third supporting substrate 900 each is made of insulating and visually transparent materials, and is formed of a material including ethylene terephthalate, polyether sulfone, polyacrylate, polyethylene naphthalate, polyethylene terephthalate, polyphenylene sulfide, polyallylate, polycarbonate, polyethylene terephthalate polyethylene terephthalate, glass or the like. In addition, the first supporting substrate 700, the second supporting substrate 800, and the third supporting substrate 900 each is a flat board, a curved board, or in different shapes.

According to the embodiments of the present disclosure, a composite substrate structure and a touch panel having composite substrate structure are provided, in which the scratch resistance and the wear resistance of the transparent substrate is promoted. Moreover, the touch panel having composite substrate structure provided can have a preferred abrasion resistance, transparency and visual effect.

The composite substrate structure according to the embodiments of the present disclosure is not limited to operating as a touch surface of a touch panel and is also highly applicable to various other products. For example, the composite substrate structure is used as a wear-resistant surface of other optical devices, such as a front lens of a camera.

Further, when the product does not require transparency, instead of the transparent substrate, a metal plate or a opaque plastic plate is applied to the composite substrate structure of the present disclosure, and used as a wear-resistant surface of the casing of various products, such as a side casing or a back cover of a cell phone, a outer casing of computers, cameras, or a home appliance, according to need.

The descriptions illustrated supra set forth simply the preferred embodiments of the present disclosure; however, the characteristics of the present disclosure are by no means restricted thereto. All changes, alterations, or modifications conveniently considered by those skilled in the art are deemed to be encompassed within the scope of the present disclosure delineated by the following claims.

What is claimed is:

1. A composite substrate structure, comprising:
   a transparent substrate;
   a diamond-like carbon layer disposed on the transparent substrate, wherein the diamond-like carbon layer has a thickness less than about 10 nanometers;
   a middle layer disposed on the diamond-like carbon layer, wherein the middle layer comprises a silicon carbon based material; and
   a hydrophobic layer disposed on the middle layer, wherein the middle layer is disposed between the diamond-like carbon layer and the hydrophobic layer;
   wherein the hydrophobic layer comprises carbon-fluorine bonds and silicon-oxygen bonds, and
   a ratio between the carbon-fluorine bonds present in the hydrophobic layer and the silicon-oxygen bonds present in the hydrophobic layer is at least 50:1.

2. The composite substrate structure of claim 1, wherein the diamond-like carbon layer has a content percentage of $sp^3$ bonds greater than or equal to about 15%.

3. The composite substrate structure of claim 1, wherein:
   the hydrophobic layer is crystalline, and
   the hydrophobic layer has a crystal proportion greater than about 50%.

4. The composite substrate structure of claim 1, wherein a first surface of the hydrophobic layer opposite to a second surface of the hydrophobic layer that is facing the diamond-like carbon layer has a contact angle greater than 110 degrees.

5. The composite substrate structure of claim 1, wherein the hydrophobic layer has a thickness ranging from about 5 nanometers to about 30 nanometers.

6. The composite substrate structure of claim 1, further comprising an adhesive layer, wherein:
   the adhesive layer is disposed between the transparent substrate and the diamond-like carbon layer, and
   the adhesive layer comprises a silicon-based material.

7. The composite substrate structure of claim 6, wherein the adhesive layer has a thickness ranging from about 5 nanometers to about 10 nanometers.

8. The composite substrate structure of claim 6, wherein the adhesive layer comprises silicon dioxide.

9. The composite substrate structure of claim 1, further comprising an anti-reflection film disposed between the transparent substrate and the diamond-like carbon layer.

10. The composite substrate structure of claim 9, wherein:
    the anti-reflection film comprises a plurality of first anti-reflection layers having a first refractive index and a plurality of second anti-reflection layers having a second refractive index,
    each of the plurality of first anti-reflection layers and each of the plurality of second anti-reflection layers are interlaced with one another in parallel,
    the first refractive index is less than the second refractive index, and
    the number of the first anti-reflection layers is equal to the number of the second anti-reflection layers.

11. The composite substrate structure of claim 10, wherein:
    the first refractive index is greater than about 1.6, and
    the second refractive index is less than about 1.55.

12. The composite substrate structure of claim 10, wherein:
  one of the first anti-reflection layers is arranged adjacent to the transparent substrate, and
  one of the second anti-reflection layers is arranged adjacent to the diamond-like carbon layer.

13. The composite substrate structure of claim 10, further comprising an adhesive layer disposed between the transparent substrate and the anti-reflection film, wherein:
  one of the first anti-reflection layers is arranged adjacent to the adhesive layer, and
  one of the second anti-reflection layers is arranged adjacent to the diamond-like carbon layer.

14. The composite substrate structure of claim 10, wherein:
  the first anti-reflection layers each are mainly formed of niobium oxide, titanium oxide, zirconium oxide, aluminum oxide, silicon oxynitride or silicon nitride, and
  the second anti-reflective layers each are mainly formed of silicon oxide or magnesium fluoride.

15. The composite substrate structure of claim 1, wherein at least 50 percent of atoms present in the hydrophobic layer are fluorine atoms.

16. A composite substrate structure, comprising:
  a transparent substrate;
  a diamond-like carbon layer disposed on the transparent substrate, wherein the diamond-like carbon layer has a thickness less than about 10 nanometers;
  a hydrophobic layer comprising carbon-fluorine bonds and silicon-oxygen bonds, wherein a ratio between the carbon-fluorine bonds present in the hydrophobic layer and the silicon-oxygen bonds present in the hydrophobic layer is at least 50:1; and
  an anti-reflection film disposed between the transparent substrate and the diamond-like carbon layer comprising a plurality of first anti-reflection layers having a first refractive index and a plurality of second anti-reflection layers having a second refractive index different than the first refractive index, wherein each of the plurality of first anti-reflection layers and each of the plurality of second anti-reflection layers are interlaced with one another in parallel.

17. The composite substrate structure of claim 16, wherein:
  the number of first anti-reflection layers is equal to the number of second anti-reflection layers.

\* \* \* \* \*